United States Patent [19]

Chong

[11] Patent Number: 4,480,318
[45] Date of Patent: Oct. 30, 1984

[54] METHOD OF PROGRAMMING OF JUNCTION-PROGRAMMABLE READ-ONLY MEMORIES

[75] Inventor: Fu C. Chong, San Jose, Calif.

[73] Assignee: Fairchild Camera & Instrument Corporation, Mountain View, Calif.

[21] Appl. No.: 349,790

[22] Filed: Feb. 18, 1982

[51] Int. Cl.$^3$ .................................................. G11C 11/40
[52] U.S. Cl. .................................... 365/104; 365/105
[58] Field of Search ............... 364/900, 200; 365/104, 365/96, 105; 357/45

[56] References Cited

U.S. PATENT DOCUMENTS

| | | | |
|---|---|---|---|
| 3,191,151 | 6/1965 | Price | 340/825.84 |
| 3,733,690 | 5/1973 | Rizzi et al. | 29/577 R |
| 3,742,592 | 7/1973 | Rizzi et al. | 29/574 |
| 3,810,127 | 5/1974 | Hoff, Jr. | 365/96 |
| 3,848,238 | 11/1974 | Rizzi et al. | 365/105 |
| 3,872,450 | 3/1975 | Reynolds | 365/96 |
| 4,153,949 | 5/1979 | Rau et al. | 365/104 |
| 4,156,926 | 5/1979 | Hartman | 364/900 |
| 4,319,341 | 3/1982 | Fukushima et al. | 365/96 |
| 4,335,457 | 6/1982 | Early | 364/900 |

FOREIGN PATENT DOCUMENTS 0124040 10/1978 Japan .

OTHER PUBLICATIONS

DeWitt et al., *Memory Array*, IBM Technical Disclosure Bulletin, vol. 10, No. 1, 6/67, p. 95.

*Primary Examiner*—Gareth D. Shaw
*Assistant Examiner*—Daniel K. Dorsey
*Attorney, Agent, or Firm*—Alan H. MacPherson; Kenneth Olsen; Carl Silverman

[57] ABSTRACT

A method of programming a cell in a PROM, wherein the cell comprises a bipolar transistor having a floating base, comprises applying a current rising with time across the emitter to collector contacts of the bipolar transistor with the collector contact serving as the reference potential, measuring the time at which the rise in voltage suddenly stops and the voltage drops a small amount, and then holding the current for a selected time following the voltage drop, thereby to insure that the emitter base junction of the bipolar transistor is destroyed while at the same time not damaging the base collector junction of the bipolar transistor.

6 Claims, 23 Drawing Figures

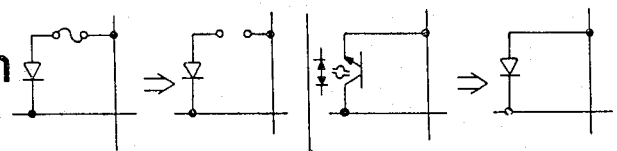
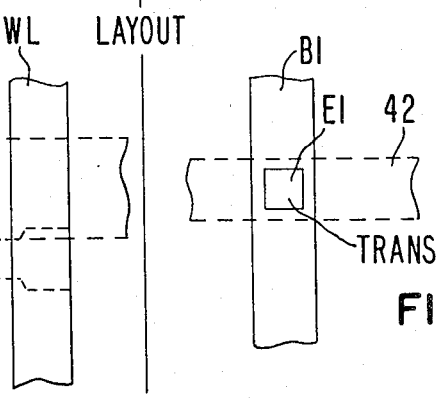
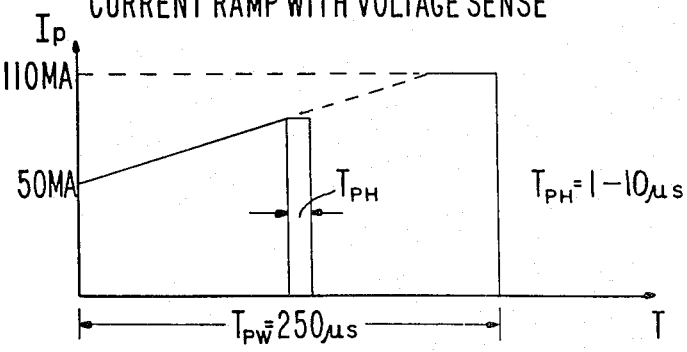
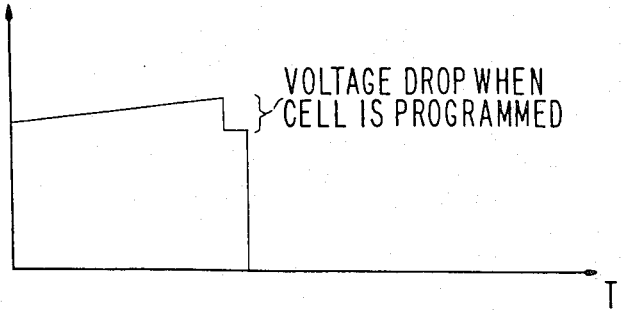

N: NUMBER OF PULSES NEEDED TO PROGRAM THE CELL

DIRECTION OF BLOW AFTER $N^{TH}$ PULSE, STOP PULSING

UNPROGRAMMED

PROGRAMMED (1) WITH IMPROVED WORD DRIVER
(2) WORD DRIVER GOES ACTIVE

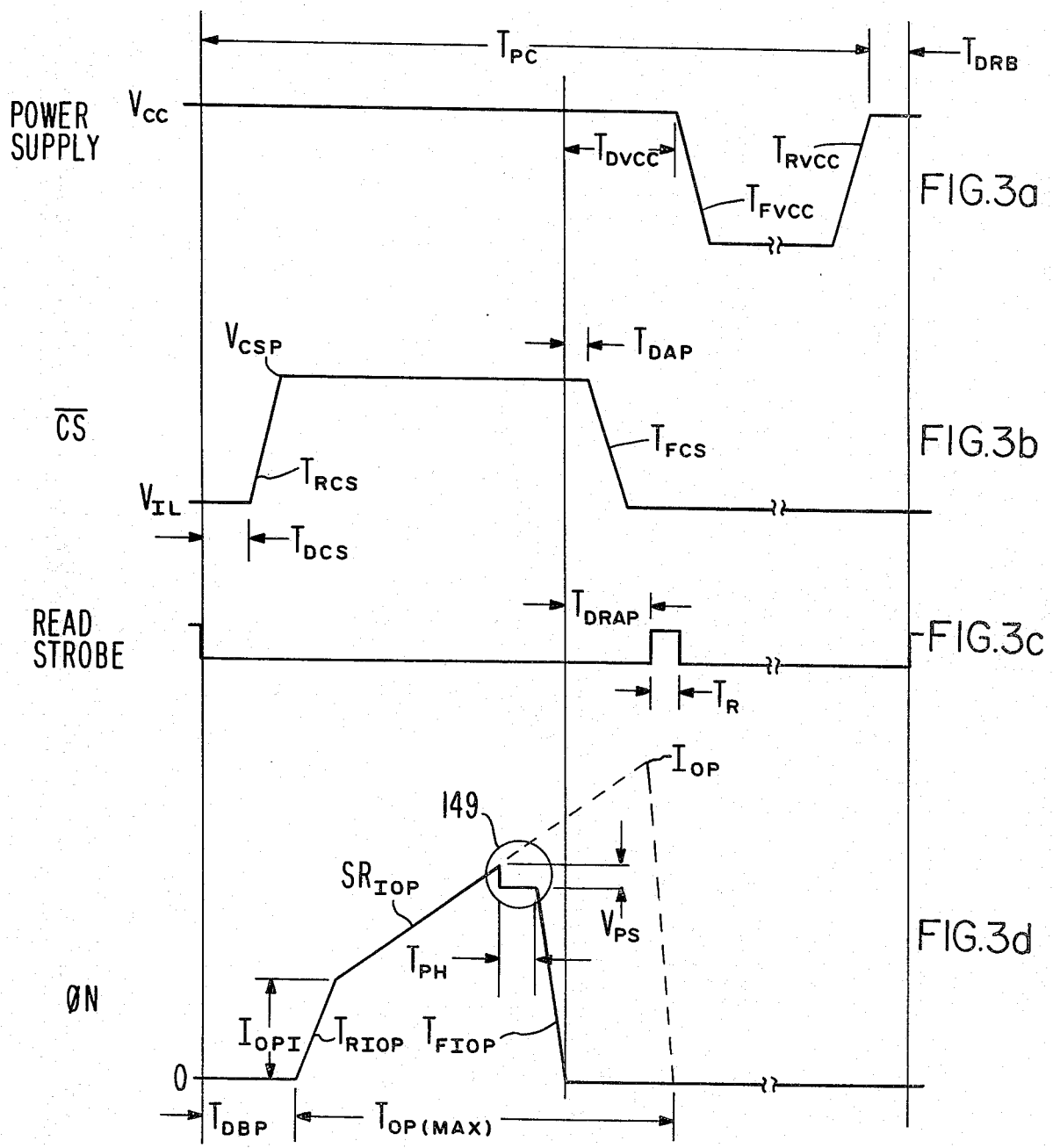

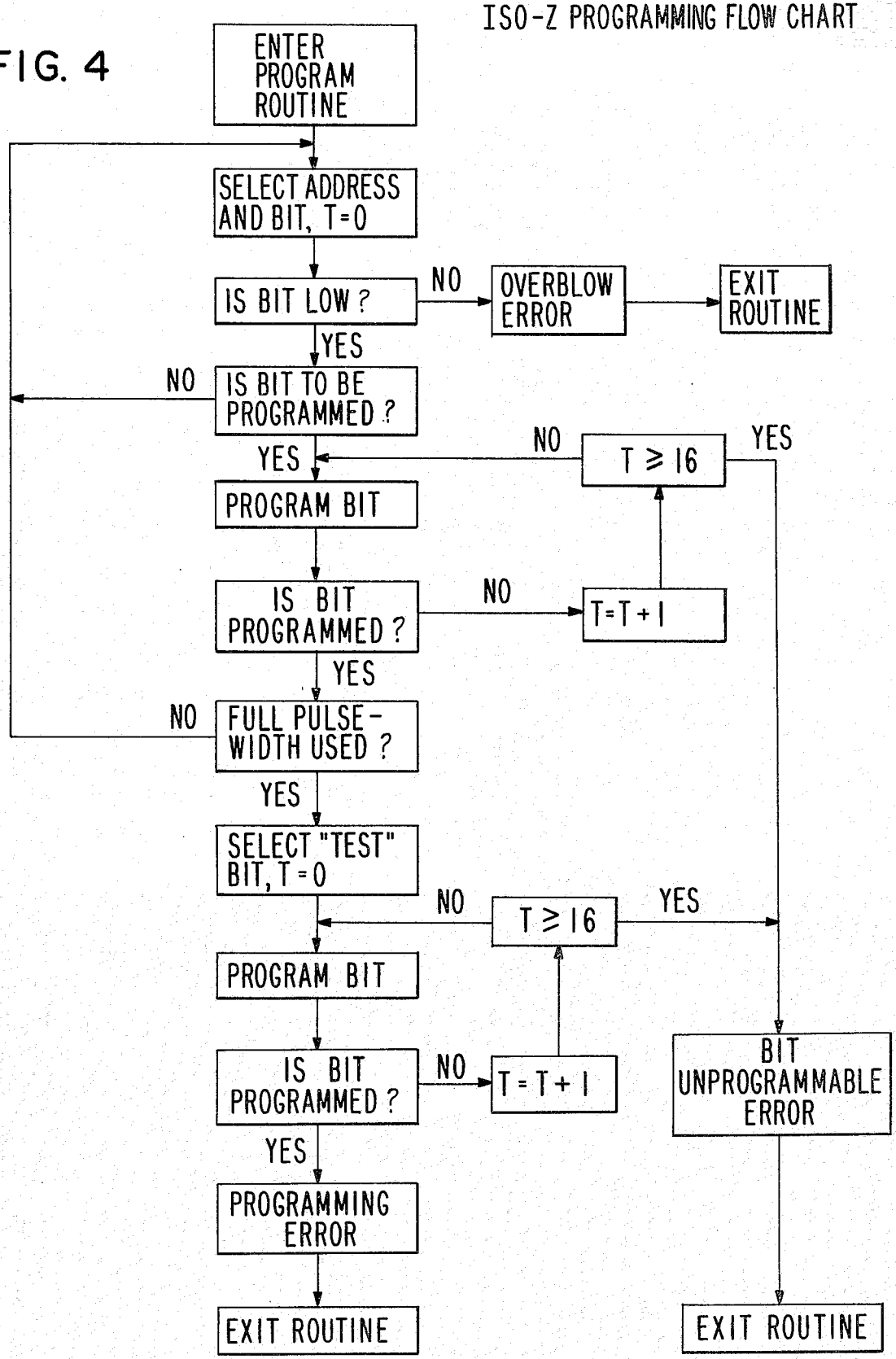

FIG. 5a
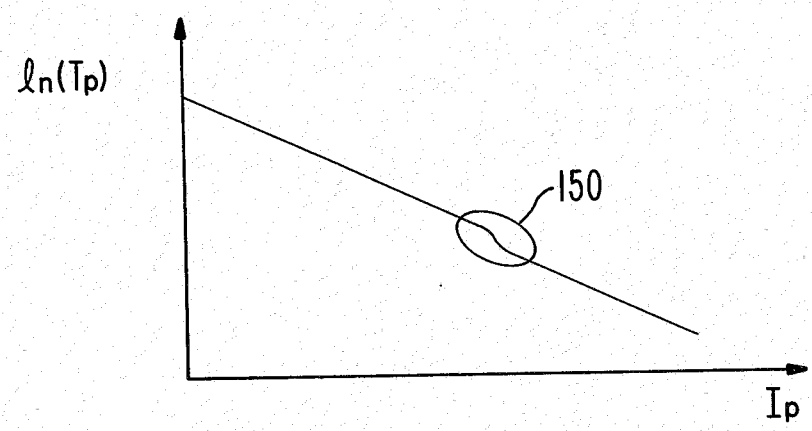
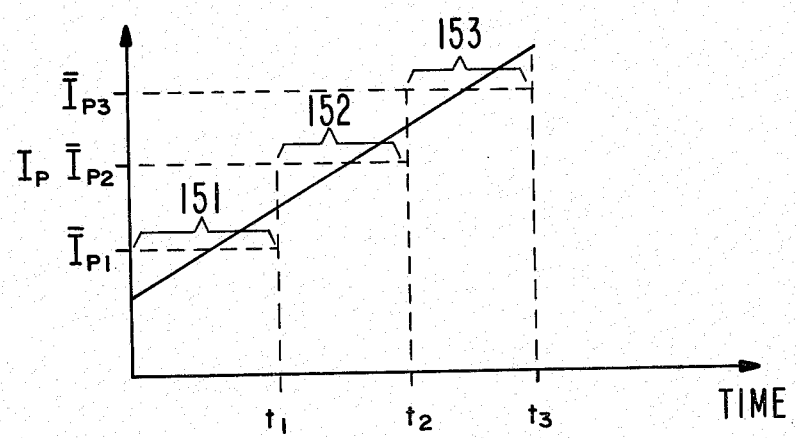
FIG. 5b

METHOD OF PROGRAMMING OF JUNCTION-PROGRAMMABLE READ-ONLY MEMORIES

BACKGROUND OF THE INVENTION

1. Field of the Invention

This invention relates to bipolar programmable read-only memories (often called "PROMs") and in particular to a process for programming junction-programmable PROMs.

2. Prior Art

Programmable read-only memories are well-known in the semiconductor arts. One of the first patents disclosing a programmable semiconductor memory is the Price U.S. Pat. No. 3,191,151 issued June 22, 1965 disclosing a programmable diode array. The Price array comprises a plurality of pairs of two diodes connected back-to-back. The array is programmed by sending a current pulse of the proper magnitude and direction through selected ones of the back-to-back diodes thereby converting the junction of each of these back-biased diodes to a short circuit without affecting the connected forward-biased diode. Price also discloses the use of a fuse which when destroyed converts the circuit from conducting to non-conducting. Additional patents disclosing programmable read-only memories include U.S. Pat. Nos. 3,733,690; 3,742,592; and 3,848,238. These patents disclose both a programmable read-only memory using avalanche breakdown to program selected devices and a method for achieving avalanche junction breakdown much as in the Price U.S. Patent No. 3,191,151.

Heretofore it has not been feasible to combine the avalanche breakdown of a PN junction with the recessed oxide isolation structure of the prior art (such as disclosed by Peltzer in U.S. Pat. No. 3,648,125 issued Mar. 7, 1972) to yield a programmable read only memory programmable by avalanche breakdown of a PN junction because the voltages required to break down such a junction were close to the breakdown voltages of oxide isolated structures. However, Shideler and Mishra, in U.S. patent application Ser. No. 336,802 filed Jan. 4, 1982, entitled "Oxide Isolation Process for Standard RAM/PROM and Lateral PNP Cell RAM" and assigned to Fairchild Camera and Instrument Corporation, the assignee of this application, turn to advantage certain of the features of the prior art oxide isolation process to provide a structure which is particularly useful in the manufacture of junction-programmable read-only memories (PROMs). In accordance with Shideler's and Mishra's invention, the breakdown voltages associated with prior art recessed oxide isolation structures and particularly the sidewall regions of the isolated semiconductor islands adjacent the recessed oxide are substantially increased. This is done by using an N type epitaxial layer on a P type substrate and turning to advantage the pile up of N type impurities adjacent the recessed oxide resulting from thermal oxidation of the epitaxial layer and by preventing P type impurities used to form channel stops in the field of the device from reaching the sidewalls of the silicon islands. In addition, the collector-emitter breakdown voltage ($LV_{CEO}$) of NPN vertical transistors formed in the semiconductor islands when this process is used to make PROMs is increased by implanting a P type impurity in those portions of the silicon islands to be occupied by the P type base regions of the NPN vertical transistors.

In one embodiment of the Shideler-Mishra invention, a PROM is made from a plurality of transistors each having an emitter, a floating base and a collector, wherein the emitter-base junction of each of selected transistors is destroyed by a programming current, thereby eliminating the need for prior art fuses (such as nichrome fuses) and the extra processing and yield difficulties associated with the nichrome process. The Shidelar-Mishra invention also allows the use of fuses for "redundant" type RAMs.

The fuses for use in a PROM device in accordance with the Shidelar-Mishra invention are walled emitter transistors (that is, transistors the emitter regions of which are laterally defined by the recessed isolation or "field" oxide) which are avalanched so as to break down the emitter-base junction.

One of the disadvantages of the prior art techniques for programming junctions is that the yield of the programmed read-only memories is lower than desired. Among the reasons for this yield loss is damage to the base-collector junctions of programmed cells due to excessive current passing through the cells after avalanching of the emitter-base junctions. Using current pulses of a constant width to program a cell by destroying the base-emitter junction often results in excessive current through the device with commensurate damage to the base-collector junction.

SUMMARY

In accordance with my invention, each cell in an array of programmable read-only memory cells is programmed with a current source ramping up in time. The duration of the ramping current pulse is variable being dependent upon when the emitter-base junction of the transistor being programmed is destroyed. The ramping current source makes possible easy detection of the destruction of a junction and the proper termination of the programming current before the base-collector junction is damaged.

Accordingly, the programming current using this technique is self-adjusting to the needs of each cell. The method of this invention allows PROM cells which vary in size to be programmed using the same current ramp. The programming method further allows one to very accurately control the resistance of the programmed cell while at the same time preventing any damage to the base collector junction of the programmed cell. Furthermore, the method of my invention allows one to program each cell in a large memory array effectively and efficiently even though leakage currents may occur throughout the memory array which, using prior art techniques, would reduce the programming current and therefore prevent certain cells located far from the power source, from being programmed. The result of my invented programming method is a high programming yield and a high reliability associated with both the programming method and the resulting programmed memory.

This invention will be more fully understood in conjunction with the following detailed description taken together with the following drawings (which, for illustrative purposes, are not drawn to scale).

DESCRIPTION OF THE DRAWINGS

FIG. 1b shows in top view a PROM cell similar to that shown in cross-section in FIG. 1a;

FIG. 1c shows in top view another embodiment of a PROM cell of FIG. 1a;

FIG. 1e 1f and 1g illustrate the reduction in device size achievable using the structure of the Shideler-Mishra invention;

FIGS. 1h and 1i are circuit schematics of the structures of FIGS. 1a and 1b, respectively, before and after programming;

FIGS. 2a through 2f illustrate the technique used to program the PROM cells of this invention;

FIGS. 3a through 3d illustrate in detail the waveforms of the signals used to program a PROM cell in accordance with this invention;

FIG. 4 is a flow chart of the logic of the programming sequence in accordance with this invention; and FIGS. 5a and 5b are graphs illustrating the advantages of the programming current ramp of this invention over prior art techniques.

DETAILED DESCRIPTION

The following description is intended to be illustrative only and is not intended to limit the scope of the invention. For simplicity, the above referenced Shideler-Mishra application is incorporated herein by reference.

The process described in the Shideler-Mishra application produces a structure compatible with my "vertical fuse" programming technique used to form PROMs by avalanching and therefore destroying selected emitter-base junctions. Of course, my programming technique can also be used with any PROM wherein a cell is programmed by avalanching and destroying a selected PN junction. To assist in understanding my invention, I will describe briefly the Shideler-Mishra structure.

Figure 1A:
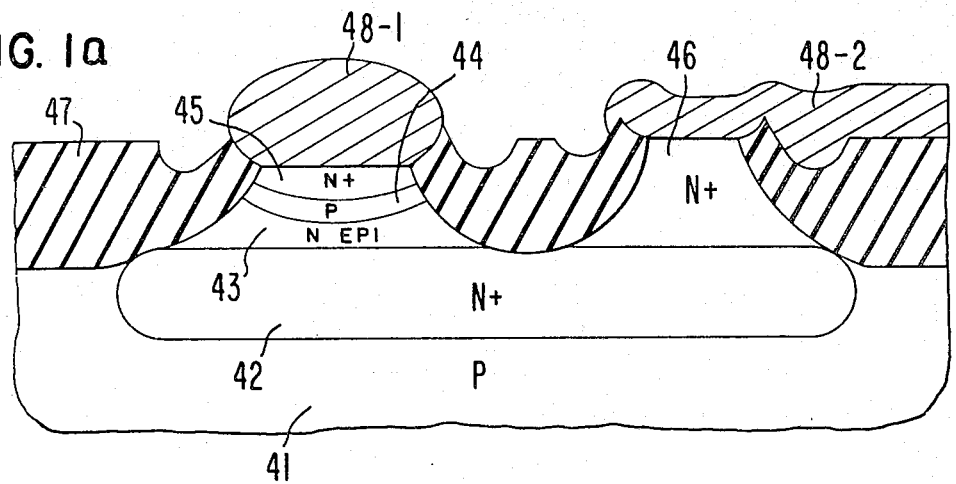
FIG. 1a illustrates in cross-section a PROM cell constructed in accordance with the Shideler-Mishra invention.

A PROM cell constructed in accordance with the Shideler-Mishra invention is shown in FIG. 1a. In FIG. 1a, P type substrate 41 has formed in it N+ buried layer 42. Formed over the top surface of substrate 41 is an epitaxial layer with N type impurity concentration. From this N epitaxial layer has been formed an epitaxial region 43 comprising part of the collector of the device, a floating P type base region 44 and an N+ emitter region 45. Collector sink 46 is shown as a hard collector sink (i.e. N+ conductivity type). In some situations sink 46 can be a soft collector sink (i.e. N conductivity type) depending upon the requirements of the memory cell. The advantage of the structure shown in FIG. 1a is that only a collector contact and an emitter contact need be formed to the device thereby reducing the cell size by eliminating the base contact area. The structure shown in FIG. 1a is formed in the manner described in the Shideler-Mishra application.

The Shideler-Mishra process is suitable for use to form programmable read-only memories because their elimination of the field predeposition common in the prior art increases the NPN base-collector breakdown voltage of the structure. Prior art oxide isolated structures have a breakdown voltage of about 16 volts. By eliminating the diffusion in the sidewalls, Shideler and Mishra raised the breakdown voltage from collector to base with emitter open ($BV_{CBO}$) to 23 to 27 volts. This allows the structure to sustain the voltage necessary to destroy the base-emitter junction (between emitter 45 and base 44 in FIG. 1a ). The current necessary to destroy the base-emitter junction depends upon the size of the emitter, the doping concentration profile and the physical layout. By controlling the lateral dimensions of the semiconductor material comprising pocket 43, for example, and similar pockets, the emitter size can be controlled to an accuracy of $\pm(\frac{1}{2})\mu$. The lateral dimensions are controlled by controlling the isolation oxide size.

By ensuring that $BV_{CBO}$ is roughly 23 to 27 volts, the current sufficient to destroy the emitter-base junction can be generated in the structure. For a given value of beta and with higher $BV_{CBO}$, a higher $LV_{CEO}$ (i.e. collector-emitter breakdown voltage) will result in accordance with the relation:

$$LV_{CEO} = BV_{CBO}/\sqrt[n]{beta} \; ;$$

where n = 3 to 4 for silicon. In order to enhance $LV_{CEO}$, an extra mask and implant is utilized only in the memory cell (i.e. not in the access circuitry) to depress beta, thus raising $LV_{CEO}$. This aids in increasing programming yields for PROMs.

Figure 1B:
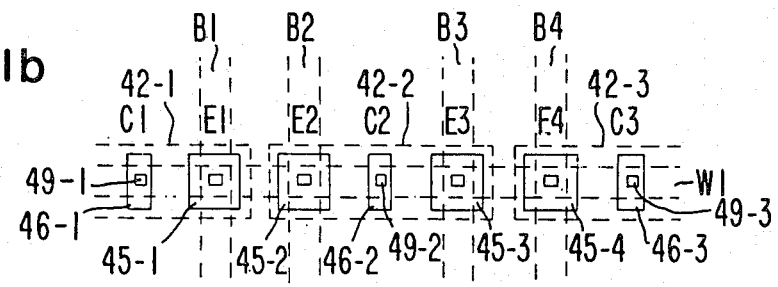

FIG. 1b shows the structure of FIG. 1a in top view with, however, a modification wherein each collector sink 46, 46-1, 46-2 and 46-3 (FIGS. 1a and 1b) is used to provide electrical contact to two active devices rather than one active device. Thus, for example, collector sink C2 (46-2) makes electrical contact to the active devices including emitters E2 and E3 (numbered 45-2 and 45-3 in FIG. 1b). Buried layer 42-2 allows electrical contact from collector sink 46-2 to the two devices containing emitters E2 and E3 underneath the isolation oxide 47 surrounding each of these two active devices. Oxide 47 defines the lateral extent of these devices.

Bit lines B1, B2, B3 and B4 are shown running vertically in the drawing. Bit lines B1 to B4 are formed on insulation over the surface of the device. Each bit line is electrically connected to those emitters underlying it through oxide cut contacts. For simplicity, these contacts are not shown in FIG. 1b. The bit lines B1 to B4 comprise the first conducting layer on the structure. A second layer of insulation is then placed over bit lines B1 to B4 (which typically are fabricated from metal but could also be fabricated of other conductive material such as selectively doped polycrystalline silicon). On top of the second layer of insulation (typically a phosphorus doped silicon dioxide or silicon dioxide-silicon nitride composite layer) is formed a series of horizontal word lines. Word line W1 is shown in FIG. 1b extending horizontally across the paper. Each word line contacts those colector regions underlying it through vias such as vias 49-1 through 49-3 as shown in FIG. 1b.

Figure 1E:
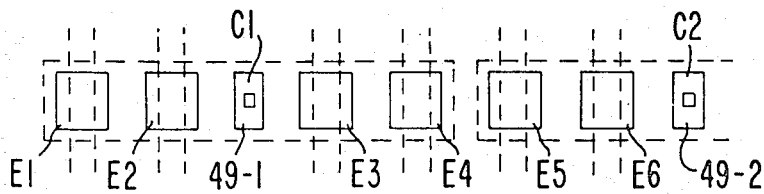

The advantage of the structure shown in FIG. 1b is that one collector sink serves two active devices, thereby eliminating half the collector sinks normally used in a PROM. Consequently, device packing density is improved. In another embodiment shown in FIG. 1e, each sink (such as C1) contacts four active devices (such as E1, E2, E3 and E4), two on each side of the sink, thereby further improving packing density. In general, up to N active devices can be contacted by each sink, where N is a selected positive integer limited by the voltage drop acceptable in the circuit.

Figure 1C:
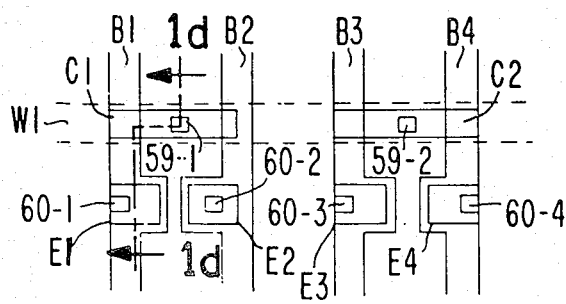

Another embodiment of the Shideler-Mishra invention similarly improving packing density of the integrated circuit by using one collector sink to contact two or more active devices is illustrated in FIG. 1c. Here the collector sink regions C1, C2 corresponding to region 46 in FIG. 1a are shown arranged horizontally across the top portion of the drawing. Word line W1 extends horizontally across the structure electrically contacting the underlying sink regions through vias 59-1, 59-2.

The devices containing emitter regions E1 and E2 are electrically connected to the corresponding collector sink region C1 by a buried layer 42 (shown in isometric cut-away view in FIG. 1d) underneath the isolation oxide 47 separating the emitter regions from the collector sink regions. Emitter regions E3 and E4 are electrically connected to collector sink region C2 by a buried contact layer similar to layer 42 shown in FIG. 1d. Bit lines B1 to B4 are formed on insulation overlying the top surface of the structure and make contact to underlying emitter regions E1 to E4 through oxide cut contacts 60-1 through 60-4 formed through this insulation. Word line W1 is formed on insulation overlying bit lines B1 to B4.

Each bit line B1 to B4 contacts a plurality of underlying emitter regions associated with other cells in a manner such as described above for emitters E1 to E4 in FIG. 1b.

Overlying the top surface of the structure including bit lines B1 to B4 is a second layer of insulation (typically a phosphorus doped silicon dioxide or a composite layer of silicon oxide and silicon nitride) and on this second layer of insulation are formed the horizontal word lines for the memory. Word line W1 is shown in FIG. 1c. Word line W1 contacts a plurality of underlying collector sinks shown as C1 and C2 in FIG. 1c through vias such as vias 59-1 and 59-2 as shown in FIG. 1c. Each word line contacts the plurality of collector sinks formed beneath the word line through vias such as shown in FIG. 1c.

Figure 1D:
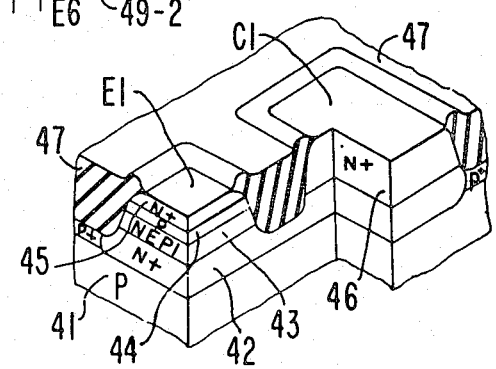
FIG. 1d is an isometric cutaway view of a portion of the structure shown in FIG. 1c.

FIG. 1d shows an isometric cut-away view of a portion of the structure shown in FIG. 1c along section 1d. FIG. 1d shows the relationship of a P-type silicon substrate 41 to the other regions formed in the substrate. N+ buried layer 42 extends underneath emitter E1 and collector sink C1 as shown and similarly under emitter E2 (not shown). Field oxide 47 defines the lateral extent of emitter E1 and collector sink C1 on all sides. Buried contact layer 42 extends underneath field oxide 47 to connect electrically emitter E1 to collector sink C1. Collector sink C1 is a hard sink having been converted to N+ conductivity type from its normal N conductivity type. N epitaxial layer 43 has formed in it P type base region 44 to which no contact is formed and N+ emitter region 45 to which electrical contact is formed from the top surface of the structure as shown in top view in FIG. 4c. FIG. 1d illustrates clearly the fact that the lateral extents of the collector sink and the emitter regions are defined by the oxide region 47 and shows the important size reductions achievable by eliminating the base contact in the PROM cell. In programming the device, the PN junction between base region 44 and emitter region 45 is selectively avalanched to break down this junction in selected transistors in the PROM (which contains a plurality of cells of the type shown in FIG. 1a) thereby to form a short circuit. The way in which this is done will be described below.

FIG. 1f and 1g show the size reduction achievable by using the structure of the Shideler-Mishra invention as compared to certain prior art NiChrome (nickel-chromium) structures. As shown in FIG. 1f, the emitter region 61 is reasonably large and is attached to one end of a fuse link 62, the other end of which is attached to a bit line such as line B1. As an alternative, the emitter region 61 can be substituted by a base-collector diode or a Schottky contact. Typically, bit line B1 is formed of a metal such as aluminum. In programming the cell, the fuse link 62 will either be left intact thereby leaving a short circuit, or blown, thereby creating an open circuit. The fuse linked together with the emitter region takes surface space and reduces packing density. A current ramp is generally not reliable in destroying a nichrome fuse unless its rise time is very fast. A slow rise time allows the $I^2R$ heat to be dissipated and causes the fuse to oxidize instead of melting.

FIG. 1g illustrates the compact structure of the Shideler-Mishra invention wherein the bit line B1 is directly contacted to the underlying transistor emitter E1 through a contact cut. The bit line again is formed of a metal such as aluminum and the buried layer 42 provides electrical contact to the emitter region E1 from a collector sink (not shown for simplicity). A comparison between prior art (FIG. 1f) and the vertical fuse structure programmed by my invention (FIG. 1g) illustrates the substantial savings in space for the vertical fuse structure of my invention.

FIGS. 1h and 1i illustrate the circuits resulting from programming the structures of FIGS. 1f and 1g, respectively.

In programming a PROM cell in accordance with my invention, one begins with an integrated circuit memory array containing a plurality of devices such as described above in FIG. 1a wherein the emitter-base junction between emitter region 45 and base region 44 functions as a typical PN junction. The cell depicted in FIG. 1a is in logic "0" state as made. Of course, the reverse logic convention could also be adopted. If it is desired to change the state of this cell to indicate a "1", this can be done by destroying the PN junction between emitter region 45 and base region 44. The mechanism by which this junction is destroyed operates beneath the surface of the semiconductor device and is not a thin film structure (such as NiCr). This eliminates the inherent reliability problems associated with thin film fused metal technology. As described above, the word line (input) to a given transistor is connected to the collector 46 (FIG. 1a) while the bit line (output) is connected to the emitter 45. By applying a sufficiently large current across the PN junction between emitter region 45 and base region 44 with this junction back-biased, locally generated heat will cause the emitter aluminum silicon contact 48-1 to reach its eutectic temperature and melt. Aluminum then migrates through the emitter region 45 and short circuits the emitter base junction between emitter 45 and base 44. The resulting structure essentially comprises a collector-base diode.

Figure 2C:
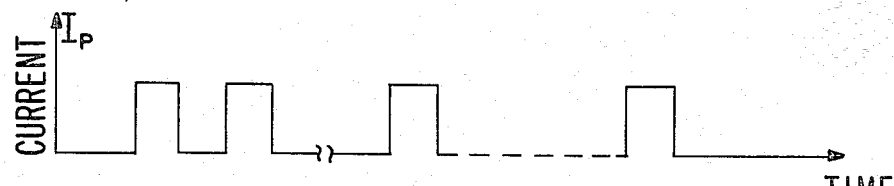
Figure 2D:
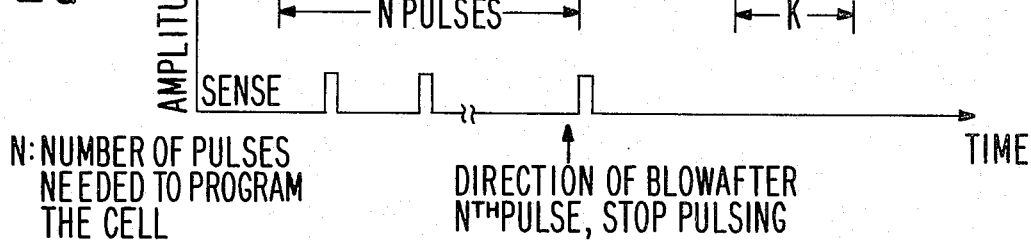

The programming procedure for programming in accordance with my invention the PROM cell of the Shideler-Mishra structure or any other structure is illustrated schematically in FIGS. 2a through 2g. In FIG. 2a, the programming current as a function of time is illustrated for use with the "vertical fuse" (i.e. short-circuited or "blown") emitter structure shown, for example, in FIGS. 1a through 1e. The optimum programming process is one which is insensitive to design and process variations of the product and which delivers the optimum amount of power to the cell to be programmed. At the same time, the programming structure and method must be sensitive to the avalanching of the emitter-base junction so as to minimize damage to the base-collector junction of the device being programmed. Accordingly, in accordance with my invention, the current source used to deliver the programming power reduces power after the avalanching of the junction and automatically shuts off power after the cell has been "programmed" (i.e., the emitter-base junction destroyed) with a selected delay time. If during programming the base-collector junction of a cell is damaged, then leakage may occur through that cell when another cell is being read or programmed. Typically the leakage path goes from the bit line attached to the emitter of the selected cell through the diode formed by the collector-base regions of a programmed but nonselected cell to the word line attached to the programmed but nonselected cell to another non-selected or "deselected" cell and through the damaged base collector junction of this another de-selected cell to the bit line attached to this de-selected cell and then through the diode formed by the collector-base junction of another programmed but nonselected cell attached to the word line connected to the selected cell. Naturally, this leakage is undesirable. A similar leakage path is generated by an abnormally low $LV_{CEO}$ in a de-selected cell. Again, this leakage path is undesirable (this leakage can prevent proper programming of the PROM) and thus proper device processing to prevent low $LV_{CEO}$ in a cell is essential to avoid the identical type of leakage to that caused by a damaged base-collector junction. Also in high density PROMs where the number of cells increases and metal line resistance becomes more significant, this problem becomes more prominent. The loss of power is compensated by the use of a current ramp.

In selecting the programming technique, the advisability of using constant current pulses of selected width was considered. Unfortunately, a constant width pulse sometimes results in base-collector junction damage of certain cells because the current required to program a cell is a function of the cell parameters such as emitter-base junction area and cell characteristics. Accordingly, I have discovered that a constant current pulse of a selected width gives poorer programming yields than desired. I have concluded that each array cell needs a different programming current because of the expected variations in cell parameters. Also, the power applied can be different because of possible existence of leaky paths. Thus, using a constant current source pulse of selected width requires frequent adjustments of the width of the current source pulse and/or its amplitude.

A variable width, constant current cell wherein the pulse width is adjusted according to the requirements of each cell yields good base-collector junctions. However, if the base-emitter junction is destroyed at the rising edge of the pulse, the detection of the destruction of this junction is difficult. Moreover, the programming current required is dependent on design and process variations.

In accordance with my invention, each cell is programmed with a current source ramping up in time. The duration of the ramping current pulse is variable, dependent upon when the emitter-base junction "blows out" (i.e. is destroyed). The ramping current source makes possible easy detection of the destruction of this junction. The programming current using this technique is self-adjusting to the needs of each cell. The result is a high programming yield and high reliability of both the programming method and the resulting programmed memory.

A current ramp used in conjunction with a voltage sense circuit (of well-known design and thus not described) in accordance with this invention is illustrated schematically in FIGS. 2a and 2b and in more detail in FIG. 3d. As shown in FIG. 2a, the current ramps up for a selected time until a drop in voltage is noted across the cell or device. A voltage sense circuit detects this drop in voltage across the cell or device and maintains the current from the current source for a small additional time $T_{pH}$ (or even allows this current to increase) which varies from 1 to 10 microseconds and then shuts off the current source. The maintenance of the current for this additional time $T_{pH}$ ensures a low resistance programmed cell and at the same time optimizes the power devoted to each cell, thus minimizing the likelihood that the base-collector junction of the programmed cell will be damaged. This minimizes the possible occurrence of leakage through the programmed cell when this cell is a de-selected cell connected in the manner described above.

A prior art technique for programming each cell uses a series of current pulses as illustrated in FIG. 2c. The current pulses are generated until a given cell is programmed. The total current through the cell is a function of the cell parameters. Following the detection of the blowing of the emitter-base by the application of a sequence of sense pulses wherein one sense pulse occurs following each current pulse, an additional K current pulses are provided to ensure low resistance in the programmed cell. The integer K represents the number of pulses required to ensure low resistance without damaging the base-collector junction. The number of pulses need to program each cell varies depending upon the characteristics of each cell. This technique does not compensate for power lost in leaky paths, variation in the power required to program different cells, nor does it achieve the time compression for programming a cell achieved using a current ramp. A current ramp, as will be examined, customizes the programming power to the needs of each cell.

Figure 2E:
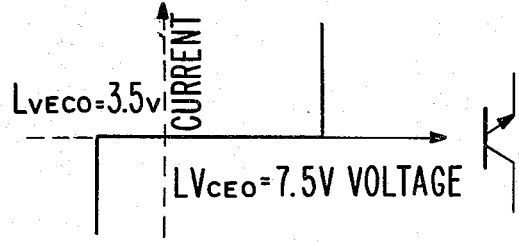
Figure 2F:
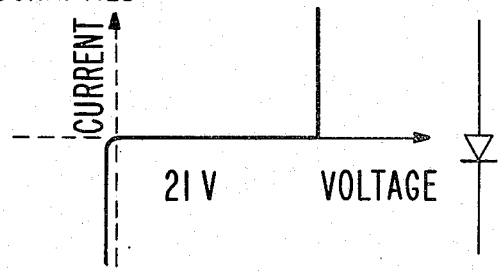

FIGS. 2e and 2f illustrate the memory cell electrical characteristics in the unprogrammed and programmed state, respectively. As noted in FIG. 2e, the $LV_{CEO}$ of the cell is about 7.5 volts when the cell is not programmed. When the emitter-base junction is destroyed, the back voltage across the diode becomes about 21 volts or greater, corresponding to the voltage breakdown across a collector-base junction using recessed oxide of the type described above in the above mentioned application of Schideler and Mishra in conjunction with FIGS. 2a–2d therein. On the other hand, the forward bias voltage across the junction is merely about 0.6 to 0.7 volts and the unprogrammed reverse-biased voltage $LB_{CEO}$ from emitter to collector with the base open is about 3.5 volts as illustrated in FIG. 2e.

Figure 2G:
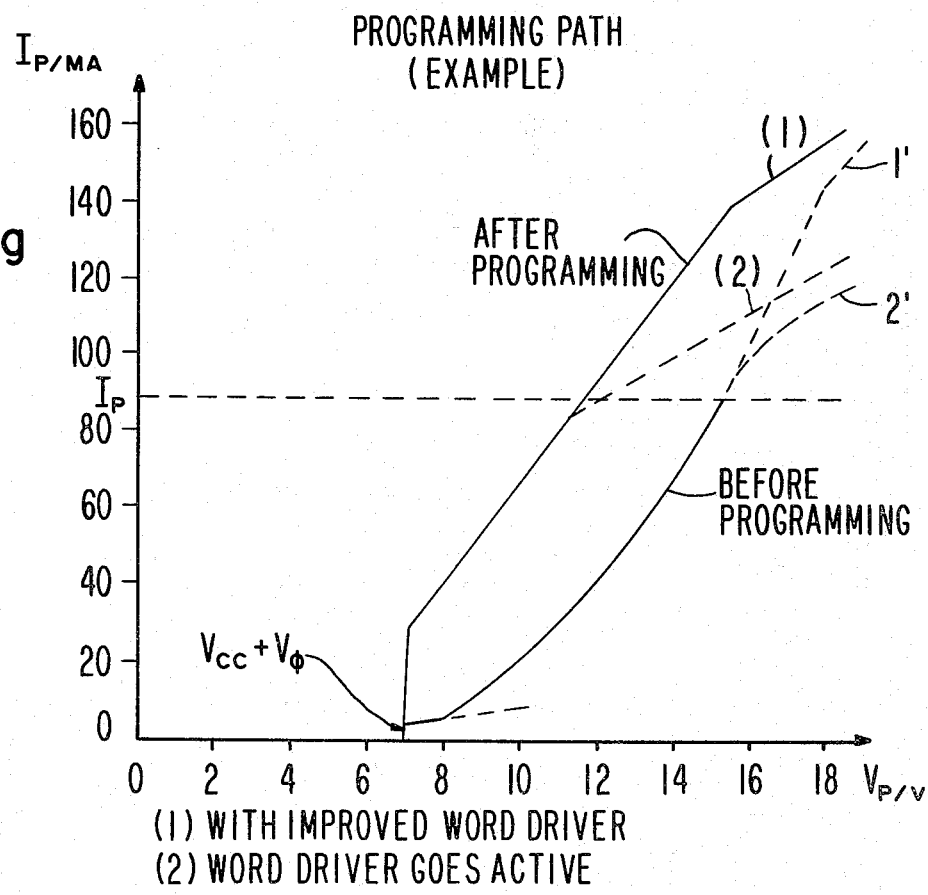
FIG. 2g illustrates the programming path I–V curve.

FIG. 2g illustrates the programming path I-V curve. As shown in FIG. 2g, the current-voltage path before programming compared to the current-voltage path after programming exhibits hysteresis such that after programming the I-V path is displaced substantially to the left on the current curve. The programming curve $I_p$ is that device current at which the cell programs.

Once the cell has been programmed, the voltage (positive voltage on emitter) across the device/cell drops drastically from about 15 volts as illustrated in FIG. 2g to about 9 volts. This plot (which displays device programming current versus device voltage) illustrates the importance of ensuring that $LV_{CEO}$ be greater than some value, related to 9 volts and, as described above, preferably in excess of 12–15 volts to ensure adequate tolerance for the programming of each cell in the array without exceeding $LV_{CEO}$.

The logic to be followed in programming a bit is illustrated in FIG. 4. As shown in FIG. 4, upon the start of the program (i.e. the "enter program routine") the address to be programmed and the bit are first selected by the program. Typically, the address is incremented one unit through the addresses of the memory with the desired state of the bit corresponding to the address determined by the program to be placed into the ROM memory. The computer program selects the address and the state of the bit and then tests to determine whether or not the bit is low. The normal state of each cell before programming is a logic "0" state. The destruction of the PN junction between the emitter region 45 and the base region 44 results in the cell being programmed to a logic "1" state. If before programming the bit read at the address is already programmed, this indicates that the device has failed because that bit should not have been programmed (that is, all bits should be in the logic "0" state at the completion of manufacture and before programming). If the bit is to be programmed, then the program automatically applies the ramp current illustrated in FIG. 2a to the bit. The program then tests to determine if the bit was programmed. If the answer is no, the program loops back to reprogram the bit by again applying the ramp current illustrated sohematically in FIG. 2a. Should after sixteen such attempts the program indicate that the bit still is not programmed, the device is considered to have failed and the programming routine is terminated. This is expressed on the logic flow chart as "bit unprogrammable error" and "exit routine". If the bit does program, the question then is whether or not a full pulse width was used. If the answer is no, the bit was properly programmed and the program loops back to the next address to be programmed. This routine is followed until the memory has been completely programmed as desired.

Should on any bit the full pulse width be used, then the next question is whether or not the test bit is programmed by the normal program sequence. If it is programmed by less than the full pulse width, yet the bit which had originally been addressed was not programmed by less than the full pulse width, then the assumption is that the part is defective and again the program exits from the routine to cease programming the memory. The memory is considered to be a reject and to have failed.

If the test bit is not programmed by the first programming current ramp, then the program loops back up to sixteen times through the test bit in an attempt to program it. Should the test bit not program after 16 attempts, the program exits from the routine and the part again is assumed to have failed.

FIGS. 3a, 3b, 3c and 3d illustrate in more detail the waveforms used to control the programming of a bit and the programming waveform associated with a programmed bit. FIG. 3a illustrates the power supply voltage $V_{CC}$. $T_{PC}$ is the period of one programming cycle. $T_{DVCC}$ is the delay to the turning off of the power following the termination of the ramped up current pulse used to program a bit. This allows the generation of a verify pulse as shown in FIG. 3c following the time $T_{DRAP}$ (representing a delay after programming) to read the bit to determine that it was programmed. This bit is read with the pulse of width $T_R$ shown in FIG. 3c. Typically, this time is a minimum of six microseconds. This pulse verifies that the bit was properly programmed. The delay $T_{DVCC}$ to turning off the power $V_{CC}$ is a minimum of ten microseconds. The fall time $T_{FVCC}$ is a maximum of about two microseconds following the completion of the programming of the bit. The rise time $T_{RVCC}$ before the programming of the next bit is likewise a maximum of about two microseconds. The delay time $T_{DRB}$ representing the time to read the next bit before programming the next bit is four microseconds. The total programming cycle tim $T_{PC}$ is a minimum of 280 microseconds.

FIG. 3b illustrates the chip select pulse shown as $V_{CSP}$. The chip select programming voltage $V_{CSP}$ has a minimum value of about 20 volts and a maximum value of 21 volts with a recommended value of 20 volts. This voltage is a low level $V_{1L}$ of 0 volts minimum to 0.4 volts maximum with a recommended value of 0 volts at the start of the programming cycle. Following the time delay $T_{DCS}$, which is a minimum of 8 microseconds and represents the delay to the beginning of the chip select pulse, the chip select pulse begins to rise. In a time $T_{RCS}$ the chip select pulse rises to the value $V_{CSP}$ representing the chip select voltage of about 20 volts. This rise time is a minimum of 1.5 microseconds with a recommended and maximum time both of 2.0 microseconds. This pulse then stays at the voltage $V_{CSP}$ until a time $T_{DAP}$ after the programming of the bit at which time this pulse drops again in a time $T_{FCS}$ (the chip select pulse fall time) to the voltage $V_{1L}$. Typically, $T_{FSC}$ is a minimum of 1.5 microseconds and has a recommended value and maximum value both of 2.0 microseconds. The delay time $T_{DAP}$ typically is 2.0 microseconds. Following the delay $T_{DRAP}$ (a delay of 6 microseconds after programming to read) the circuitry produces a strobe pulse of duration $T_R$ which reads the bit to determine that it is programmed. This strobe pulse has a maximum duration of about 2 microseconds.

The characteristics of the programming current are shown in more detail in FIG. 3d. The graph in FIG. 3d is of current versus time except within circle 149 where it depicts the voltage drop $V_{PS}$. In fact, the current through the cell in region 149 will remain substantially constant or in one embodiment be allowed to increase continuously even during the hold time following program. Accordingly, it should be understood that the curve of FIG. 3d depicts a composite of both voltage and current and the curve of FIG. 2a depicts more accurately the actual current flow through the cell following programming. As shown in FIG. 3d, the programming pulse remains at about zero current until a time delay $T_{DBP}$ (representing the delay to programming pulse) of about 12 microseconds minimum has expired. Following this, the current pulse rises at a relatively steep rate for a time perio $T_{RIOP}$ representing the initial programming current ramp rise time. This time is about 0.5 microseconds minimum and 3.0 microseconds maximum and the maximum current resulting from this initial current ramp is about 20 milliamps minimum and recommended value to about 25 milliamps maximum. Following this steep current rise, the current pulse rises at a slower rate denoted by $SR_{IOP}$ denoting the programming current ramp slew rate of about 1 milliamp per microsecond. The dashed line shows that this current ramp would rise to a maximum value of $I_{OP}$ of about 150 milliamps minimum and 160 milliamps recommended and maximum. However, should the bit program, as planned, it will program before this current ramp reaches that voltage. At the programming time the voltage associated with the current ramp drops by the voltage $V_{PS}$ (typically about two volts) representing the destruction of the emitter-base junction between emitter region 45 and base region 44. The current is then held following the programming for the time $T_{PH}$ (which is called the hold time after programming) which equals a minimum of 1.4 microseconds, a maximum of 1.6 microseconds with a recommended value of 1.5 microseconds. Following the time $T_{PH}$, the current ramp drops to zero voltage in the time $T_{FIOP}$. This time typically is a few microseconds. The resulting actual current pulse is thus less in time than the theoretically maximum current pulse of $T_{OP}$(maximum) which represents the maximum programming pulse width. In one embodiment, this maximum pulse width was about 139 microseconds minimum to 140 microseconds maximum and recommended. This time period is shown in FIG. 3d.

The rising of the current ramp rapidly in time $T_{RIOP}$ not only properly initalizes the sense circuitry, but also saves time. The detection of the destruction of the base emitter junction is accomplished by sensing the sharp drop in programming ramp voltage (approximately 2 volts) at the time the junction is destroyed. The current is then held (or even allowed to increase) for the time $T_{PH}$ to insure a completely destroyed junction and then the programming current is dropped back to zero milliamps in the time $T_{FIOP}$.

After application of the current ramp, a logical "1" is verified by lowering the chip select programming voltage (FIG. 3b) to zero volts and then reading the output from the cell with the strobe pulse of FIG. 3d. If the bit has not been programmed, the programming cycle is repeated again up to 15 times. As described above in conjunction with the programming logic, if the bit remains at a logical "0" after a total of 16 attempts, the part is considered a failure.

If the bit has been verified as programmed, the logic then further tests to determine whether or not the time duration of the current ramp required to do the programming was less than $T_{OP}$(maximum). If it was, then the power supply is turned off as shown in FIG. 3a for no less than $T_{OFF(MIN)}$ which is a minimum of 115 microseconds. This is done to insure that the heat generated throughout the device by the programming and other currents is adequately dissipated before proceeding to program the next bit.

If the time duration of the current ramp required before programming of the bit was equal to or greater than $T_{OP}$ (maximum) which is the maximum programming pulse width and typically is 139 microseconds minimum to 140 microseconds recommended and maximum, the part is considered a failure because the correct destruction of the emitter-base junction is signaled by a 2-volt voltage drop which did not happen. Accordingly, if such a drop was not sensed, it is possible that excessive current may have been applied to the bit and the array thereby possibly damaging or destroying the collector base junction of the bit being programmed.

Once all the appropriate bits in the memory have been successivly programmed and verified, the programming process is considered to be complete.

It should be mentioned that before any cell is programmed to represent a logic "1" rather than the logic "0" which each cell represents as manufactured, two operations must be performed. The first is a "blank" check of all the addresses in the PROM to insure that the desired data can be programmed into the PROM and to insure that each cell is indeed a "0". The second step is to read a "test" bit fabricated on the wafer to insure that any prior attempts at programming did not damage the device. This test bit is read, in one embodiment, by applying 12 volts ±0.5 volts to one of the address inputs and $V_{IL}$ to all other address inputs with the chip selected. One of the output bits is then read and should be a logic "0" ($V_{01}$) to pass the test. The specific address input and output bit depends upon the product. However, the power supply voltage for these two operations is about 6.5 volts. If the device passes both of these tests, it is then considered ready to be programmed.

During the application of a current ramp to a given cell, the voltage drop circuit (i.e. the circuit that detects the voltage drop $V_{PS}$ following the programming of a cell) should be inhibited for about the first 3 microseconds during the initialization of the current ramp due to possible overshoot of the current and drop in the voltage associated with the current as it returns to its nominal value. This inhibition circuit prevents the sense circuit from interpreting this drop incorrectly as indicating the programming of the cell.

After all the cells in the memory to be programmed have been programmed, the entire memory is read and compared with the input code. Any discrepancy between the programmed state of the memory and the input code causes the memory to be rejected.

In the above description, pulse delays are measured to where the level is to change, pulse widths are measured after the level has been reached and rise and fall times are measured from 10% to 90% of amplitude.

Programmable read only memories programmed in accordance with the above method have achieved extremely promising reliabilities and yields. Initial data indicates programming yields in excess of 97% and no cell related failures in over 27 billion cell hours of life test. In tests conducted on a 2048×8 bit, 16K PROM, the results of over 1.7 million device hours at 125 degrees C. ambient temperature showed a failure rate of less than 0.12% per 1,000 hours.

Additional advantages of my programming method are that the current ramp technique has the advantage of minimizing the effect of socket contact resistance during programming. The current needed to program the cell is more than an order of magnitude greater than maximum sense or read currents thus eliminating the possibility of accidentally programming an unprogrammed cell during normal device operation. In one embodiment, the programming sequence utilizes a voltage ($V_{CSP}$ equal 20 volts) on the chip select to provide extra base drive to the programming circuitry. This guards against loss of power to the cell during programming.

FIGS. 5a and 5b illustrate graphically the advantages of the programming current ramp of this invention over prior art techniques. FIG. 5a is a graph illustrating the log of the time to program a cell $T_P$ plotted versus the programming current $I_P$. FIG. 5a has as the ordinate $\ln(T_P)$ and as its abscissa the programming current. This curve shows that the $\ln(T_P)$ decreases substantially linearly as programming current increases. However, region 150 of this curve shows a small knee in the relationship the cause of which is not understood. However, this small knee does not detract from the essential linearity of the curve of $\ln(T_P)$ versus $I_P$. FIG. 5b illustrates how the relationship of FIG. 5a has been turned to advantage by the ramping current of this invention.

The increased current $I_P$ as a function of time generated in accordance with this invention can be represented schematically by an average $\bar{I}_P$ during time $t_1$, an average current $\bar{I}_{P2}$ during the time between $t_1$ and $t_2$, and an average current $\bar{I}_{P3}$ during the time between $t_2$ and $t_3$. Naturally, if one were to break the time into more segments, an additional number of average currents could be created. The ramping current results in a continuously decreasing time to program as the current increases. Accordingly, should the cell not program as a result of average current $\bar{I}_{P1}$ generated during the time $t_1$, then a shorter time should be required to program the cell using the average current $\bar{I}_{P2}$ generated during the time $t_1$ to $t_2$. Should the cell not program during this time interval, an even shorter time should be required to program the cell using the average current $\bar{I}_{P3}$ generated between the times $t_2$ and $t_3$. Accordingly, the ramping current of this invention results in a current level which automatically adapts to the requirements of each cell therefore customizing the power required to program a cell to the needs of that cell.

Each PROM usually has an internal test row and test column. These extra cells are accessed by applying special voltages to selected input pins on the device. During wafer test, these test cells are addressed and programmed in patterns specifically designed to detect word line and bit line shorts, addressability problems, cell leakages and other possible defects. Tests are done on every cell in the test array during wafer test to insure cell integrity and to detect any abnormal cell. Additional bits in the test row and test column are again programmed during final test after packaging to insure high quality. These cells are again used to retest the DC and AC performance of the device. The result, together with the programming technique of this invention, produces a PROM of high quality and with high programming yields.

While embodiments of this invention have been described, these descriptions are meant to be illustrative only and are not intended to limit the scope of the invention. Other embodiments of this invention will be obvious to those skilled in the art. In particular, the PROM programming methods described herein can be applied to emitter-base or PN junctions in structures other than those described in the above-referenced Shideler-Mishra application.

I claim:

1. The method of programming a transistor in a PROM, said transistor comprising a collector region of first conductivity type, a base region of second conductivity type and an emitter region of first conductivity type, wherein a first electrical contact is formed to said collector region and a second electrical contact is formed to said emitter region, comprising:
    applying a current rising with time across said emitter to collector contacts so as to reverse bias the emitter-base junction and to generate a voltage across said emitter to collector contacts;
    detecting the programming time at which the rise in said voltage suddenly stops and said voltage drops and
    holding said current for a selected time $T_{PH}$ following said voltage drop;
    causing the emitter-base junction to be destroyed and a low resistance path to be created through the remainder of the transistor, without damage to the remainder of the transistor.

2. The method of claim 1 wherein said time following the drop in voltage during which the current is held is selected to produce a low resistance path through the emitter-base junction and through the base-collector junction and to ensure that the base-collector junction is undamaged.

3. The method of claim 2 wherein said time, $T_{PH}$ during which said current is held comprises between 1–10 microseconds.

4. The method of claim 1 wherein said voltage across said emitter to collector contacts is dropped to zero following said selected time after detecting the drop in said voltage.

5. A transistor in a PROM programmed by the method of claim 1, 2, 3 or 4.

6. The method of programming a PN junction in a PROM comprising
    applying a current rising with time across said PN junction so as to reverse bias said PN junction and to create a voltage across said PN junction;
    detecting the programming time in which the rise in said voltage suddenly stops and said voltage drops; and
    holding said current for a selected time $T_{PH}$ following the voltage drop thereby to cause the PN junction to be destroyed and low resistance path to be created across said PN junction without damage to the remainder of the PROM.

* * * * *

UNITED STATES PATENT AND TRADEMARK OFFICE
CERTIFICATE OF CORRECTION

PATENT NO. : 4,480,318

DATED : October 30, 1984

INVENTOR(S) : Fu C. Chong

It is certified that error appears in the above—identified patent and that said Letters Patent is hereby corrected as shown below:

Column 2, line 12, delete "Shidelar" and substitute --Shideler--;

Column 4, line 26, delete "n = 3to 4" and substitute --n = 3 to 4--;

Column 5, line 60, delete "4c" and substitute --1c--;

Column 6, line 31, delete "my" and substitute --the Schideler-Mishra--;

Column 8, lines 16 and 19, delete "$T_{pH}$" and substitute --$T_{PH}$--;

Column 8, line 45, delete "examined" and substitute --explained--;

Column 8, line 55, delete "above" (first occurrence);

Column 8, line 60, delete "$LB_{CEO}$" and substitute --$LV_{ECO}$--;

Column 8, line 67, delete "curve" (second occurrence) and substitute --current--;

Column 13, line 1, after "$T_p$", insert --)--;

Column 13, lines 1 and 2 should be standard type, not small type;

Column 13, line 12, delete "/P" and substitute --$\bar{I}_p$--;

UNITED STATES PATENT AND TRADEMARK OFFICE
CERTIFICATE OF CORRECTION

PATENT NO. : 4,480,318

DATED : October 30, 1984

INVENTOR(S) : Fu C. Chong

It is certified that error appears in the above—identified patent and that said Letters Patent is hereby corrected as shown below:

Column 13, line 13, delete "/$P_2$" and substitute --$\bar{I}_{P2}$--;

Column 13, line 14, delete "/$P_3$" and substitute --$\bar{I}_{P3}$--;

Column 14, line 50, between "and" and "low" insert --a--.

Signed and Sealed this

Fifteenth Day of October 1985

[SEAL]

Attest:

*Attesting Officer*

DONALD J. QUIGG

*Commissioner of Patents and Trademarks—Designate*